(12) United States Patent
Hattori et al.

(10) Patent No.: US 7,652,902 B2
(45) Date of Patent: Jan. 26, 2010

(54) INTEGRATED-INVERTER ELECTRIC COMPRESSOR

(75) Inventors: Makoto Hattori, Aichi-ken (JP);
Takayuki Takashige, Aichi-ken (JP);
Kazuki Niwa, Aichi-ken (JP); Koji Nakano, Aichi-ken (JP); Shunsuke Yakushiji, Aichi-ken (JP); Makoto Ebisawa, Ibaraki-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 207 days.

(21) Appl. No.: 12/005,412

(22) Filed: Dec. 27, 2007

(65) Prior Publication Data

US 2008/0205107 A1      Aug. 28, 2008

(30) Foreign Application Priority Data

Feb. 28, 2007    (JP) .............................. 2007-049868

(51) Int. Cl.
*H02M 1/00* (2007.01)
*H02M 5/00* (2006.01)

(52) U.S. Cl. .................. 363/147; 363/145; 363/146

(58) Field of Classification Search ................ 363/124, 363/145, 146, 147
See application file for complete search history.

(56) References Cited

U.S. PATENT DOCUMENTS 5,077,595 A * 12/1991 Fukunaga .................. 257/659

| 5,253,156 | A | * | 10/1993 | Sakurai et al. | 363/98 |
| 5,313,150 | A | * | 5/1994 | Arakawa et al. | 318/768 |
| 6,552,912 | B1 | * | 4/2003 | Kanazawa et al. | 361/752 |
| 2007/0115707 | A1 | * | 5/2007 | Koide | 363/146 |

FOREIGN PATENT DOCUMENTS

JP           3760887 B2      3/2006

* cited by examiner

*Primary Examiner*—Bao Q Vu
(74) *Attorney, Agent, or Firm*—Westerman, Hattori, Daniels & Adrian, LLP (57) ABSTRACT

An object is to provide an integrated-inverter electric compressor that can enhance assembly and vibration resistance of power semiconductor switching devices and control substrates thereof constituting the inverter device. The integrated-inverter electric compressor, in which an inverter device is installed in an inverter container provided on an outer circumference of a housing, includes a plurality of IGBTs constituting the inverter device and a guide member having a plurality of guide holes for passing terminals of the IGBTs provided between the control substrate and the IGBTs. The guide member is provided with at least one first positioning pin, fitted in positioning holes provided in a mounting surface of the IGBT, in one side surface facing the IGBT, and at least one second positioning pin, fitted in positioning holes provided in the control substrate, in another side surface facing the control substrate.

8 Claims, 9 Drawing Sheets

INTEGRATED-INVERTER ELECTRIC COMPRESSOR

BACKGROUND OF THE INVENTION

1. Field of the Invention

The present invention relates to an integrated-inverter electric compressor that is particularly suitable for use in an air-conditioning apparatus of a vehicle.

This application is based on Japanese Patent Application No. 2007-049868, the content of which is incorporated herein by reference.

2. Description of Related Art

Recently, the automobile industry has been rapidly promoting the development and commercialization of electrically driven vehicles, such as hybrid vehicles, electric vehicles, and fuel-cell-powered vehicles, to improve energy efficiency.

These vehicles employ air-conditioning apparatuses that, unlike conventional air-conditioning apparatuses, are provided with electric compressors driven by electrically powered motors.

These electric compressors are sealed electric compressors having a compressor and an electric motor in a housing and convert DC power from the power supply into three-phase AC power via an inverter device to supply the three-phase AC power to the electric motor so that the rotational speed of the compressor can be variably controlled according to the air-conditioning load.

For such an inverter-driven electric compressor, many integrated-inverter electric compressors that integrate inverter devices with housings thereof have been proposed.

An inverter device that has been proposed as the above-described integrated-inverter electric compressor has a structure in which six power MOS transistor modules (power semiconductor switching devices) constituting upper-arm switching devices and lower-arm switching devices for the three-phase inverter are disposed on a flat base surface of the outer circumferential surface of a motor housing; a printed-circuit board or the like, on which a plate with built-in busbars and an inverter control circuit are mounted, is disposed thereabove; and three terminals bent upward and extending from a side surface of each power MOS transistor module are fitted in connecting holes of the plate with built-in busbars by soldering (for example, see the Publication of Japanese Patent No. 3760887).

However, with the inverter device of the integrated-inverter electric compressor disclosed in the Publication of Japanese Patent No. 3760887, when assembling and mounting the power MOS transistor modules, the terminals bent upward and extending from the side surface thereof are easily misaligned. Because the number of terminals to be mounted is large (a total of 18 terminals are to be mounted, three terminals being mounted on each of the six power MOS transistor modules), assembly is difficult when fitting them in connecting holes provided in a plate with built-in busbar.

In addition, vertical vibrations are transmitted to the inverter device from the vehicle via the housing of the electric compressor. These vibrations are also transmitted to the power MOS transistor modules, and, in particular, when an excessive force due to these vibrations is applied to the terminals in the bending direction, the terminals may break, which is problematic in terms of vibration resistance.

BRIEF SUMMARY OF THE INVENTION

The present invention was conceived in light of the above circumstances, and an object thereof is to provide an integrated-inverter electric compressor that can enhance assembly and vibration resistance of power semiconductor switching devices and control substrates thereof constituting the inverter device.

To achieve the above-described objects, an integrated-inverter electric compressor according to the present invention provides the following solutions.

The integrated-inverter electric compressor according to the present invention, in which an inverter container is provided on an outer circumference of a housing accommodating an electric compressor, and an inverter device for converting DC power to three-phase AC power and supplying the converted power to an electric motor is installed in the inverter container, wherein the inverter device comprises a plurality of power semiconductor switching devices from which respective pluralities of terminals extend; and a control substrate which has a plurality of connecting holes for fitting the terminals and on which a circuit for operating the power semiconductor switching devices is mounted; a guide member having a plurality of guide holes for passing the terminals is provided between the power semiconductor switching devices and the control substrate; and the guide member is provided with at least one first positioning pin, fitted in positioning holes provided in mounting surface of the power semiconductor switching devices, in one side surface facing the power semiconductor switching devices, and at least one second positioning pin, fitted in positioning holes provided in the control substrate, in another side surface facing the control substrate.

The power semiconductor switching devices of a three-phase inverter, for example, are formed of three upper-arm switching devices and three lower-arm switching devices (a total of six switching devices), from each of which three terminals extend. These power semiconductor switching devices are usually secured on the mounting surface by screws with the corresponding terminals facing each other and with the upper-arm switching devices and the lower-arm switching devices arranged in two straight lines.

According to the present invention, because the guide member having guide holes for passing the above-described 18 terminals is disposed between the power semiconductor switching devices and the control substrate, which are facing each other, the terminals, which are easily misaligned when being mounted, can be aligned by this guide member to fit in the connecting holes of the control substrate. Accordingly, it is possible to easily assemble the power semiconductor switching devices and the control substrate, and eventually the inverter device. In addition, because the guide member is positioned and secured by the first positioning pins and the second positioning pins which are fitted in the positioning holes in the mounting surface for the power semiconductor switching devices and the positioning holes in the control substrate, each terminal of the power semiconductor switching devices can be secured by the guide member. Accordingly, the terminals can be protected from external forces caused by vibrations or the like applied to the terminals; therefore, the vibration resistance of the inverter device can be enhanced.

In the integrated-inverter electric compressor according to the present invention, the second positioning pin may be provided with a stepped portion having a predetermined height at a base portion thereof, and the step surface thereof may be positioned in contact with the control substrate.

With this configuration, because the position of the control substrate is determined by the step surfaces of the stepped portions having a predetermined height provided at the base portions of the second positioning pins, a space corresponding to the height of the stepped portions is formed between the guide member and the control substrate. Accordingly, when the terminals are soldered to the control substrate, even if the solder flows between the guide member and the control substrate, there are no adverse affects on the control substrate, for example, deformation of the substrate caused by contact with the solder and so on. The assembly quality and the reliability of the inverter device can thus be enhanced.

Furthermore, in the integrated-inverter electric compressor according to the present invention, the guide member may be integrally formed of a rectangular resin molded object whose cross section is an angular-U-shape and which has flanges perpendicularly protruding from both edges of a guide body, and the flanges may be positioned in contact with an upper surface of the power semiconductor switching devices or the mounting surface thereof.

With this configuration, because the guide member is integrally formed of a rectangular resin molded object including the flanges perpendicularly protruding from both edges of the guide body, whose cross section is the angular-U-shape, it requires only a thickness corresponding to the space between the power semiconductor switching devices and the control substrate, and the guide member having the first and the second positioning pins can be integrally formed as a thin resin molded object. Therefore, it is possible to minimize the weight and cost of the guide member.

Furthermore, in the integrated-inverter electric compressor according to the present invention, the first positioning pins and the second positioning pins may be provided in pairs at corners of the guide member on diagonal lines that cross each other.

With this configuration, because the first positioning pins and the second positioning pins are provided in pairs at corners of the guide member on diagonal lines that cross each other, the guide member can be accurately positioned and secured without spaces between it and the positioning holes of the mounting surfaces and the control substrate by each pair of first positioning pins and second positioning pins. Accordingly, the assembly accuracy of the inverter device can be enhanced and the quality and reliability thereof can thus be improved. In addition, the terminals of the power semiconductor switching devices can be secured via the guide member, thus allowing the terminals to be protected from external forces caused by vibrations or the like.

Furthermore, in any of the above-described integrated-inverter electric compressors according to the present invention, an electrical insulating film may be disposed between the power semiconductor switching devices and the control substrate, and may be provided with an opening with which the angular-U-shaped cross section of the guide body is fitted.

With this configuration, because the opening, in which the angular-U-shaped cross section of the guide body is fitted, is provided in the electrical insulating film provided between the power semiconductor switching devices and the control substrate, it is possible to install the electrical insulating film at a predetermined position without any positional shifting by fitting the openings in the electrical insulating film with the angular-U-shaped cross section of the guide body, and by using the guide body as a positioning guide. Accordingly, ease of assembly of the electrical insulating film can thus be improved.

Furthermore, in any of the above-described integrated-inverter electric compressor according to the present invention, the terminals extending from upper-arm switching devices and lower-arm switching devices of the power semiconductor switching devices may be arranged in a straight line; and the guide holes provided in the guide member in correspondence with the terminals may be arranged in two straight lines.

With this configuration, the terminals extending from each of the upper-arm switching devices and the lower-arm switching devices of the power semiconductor switching devices are arranged in respective straight lines, and the guide holes provided in the guide member in correspondence with the terminals are arranged in two straight lines. Accordingly, each terminal can be passed through the corresponding guide hole of the guide member and arranged in two straight lines, thus allowing the aligned terminals to be fitted in the connecting holes of the control substrate. Therefore, the operation of fitting the control substrate to the terminals can be carried out more easily, thus allowing ease of assembly of the power semiconductor switching devices, the guide member, and the control substrate, and eventually the inverter device, to be improved.

According to the present invention, the terminals, which are easily shifted when being mounted, are aligned by the guide member provided between the power semiconductor switching devices and the control substrate and are fitted in the connecting holes of the control substrate. Accordingly, installation of the power semiconductor switching devices and the control substrate, and eventually the inverter device, can be improved. In addition, because the terminals can be secured with the guide member and protected from external forces caused by vibrations or the like applied to the terminals, the vibration resistance of the inverter device including the power semiconductor switching devices can be enhanced.

DETAILED DESCRIPTION OF THE INVENTION

An embodiment according to the present invention will now be described with reference to FIGS. 1 to 9.

Figure 1:
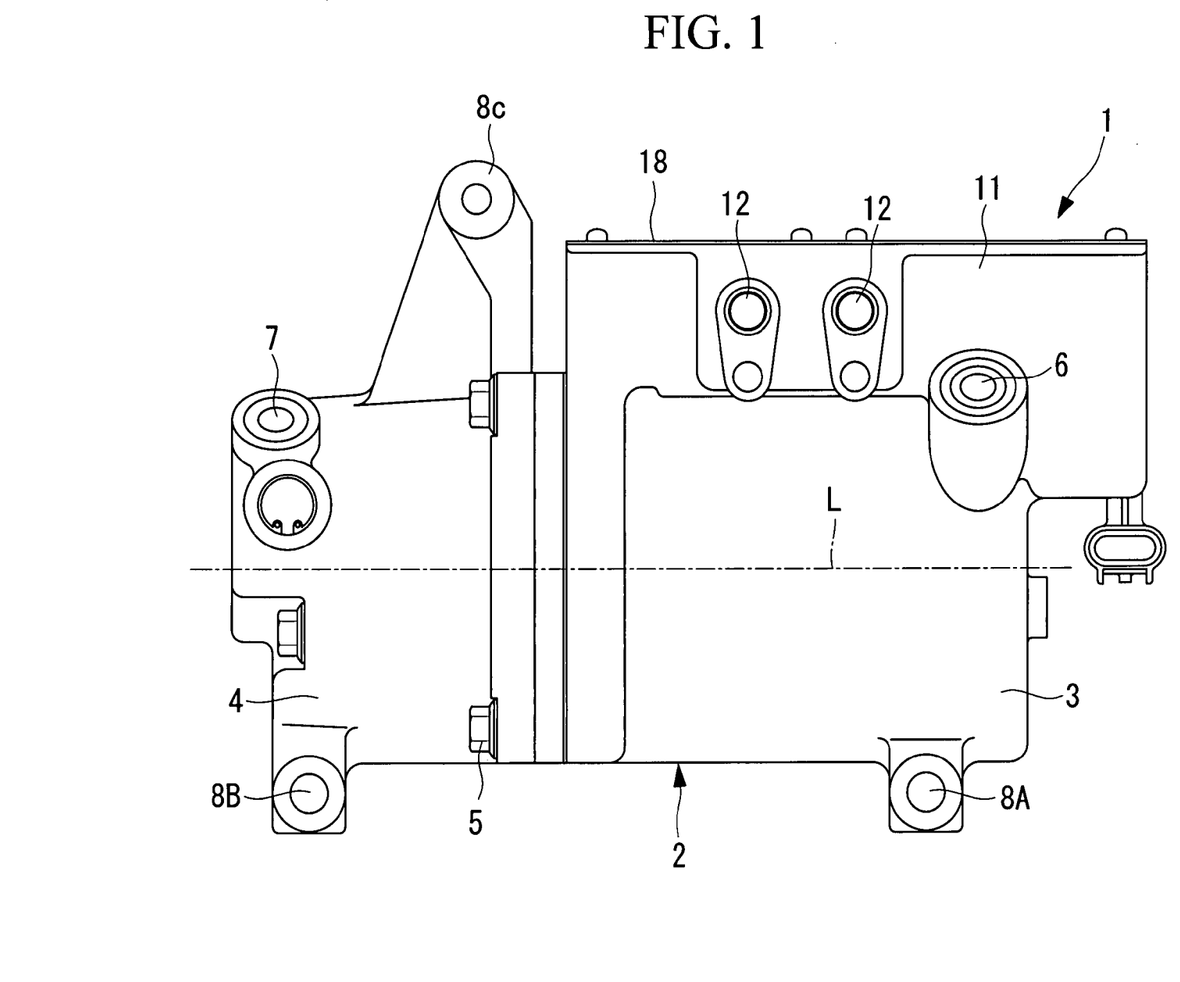
FIG. 1 is an external side view of an integrated-inverter electric compressor according to one embodiment of the present invention.

FIG. 1 is an external side view of an integrated-inverter electric compressor 1 according to one embodiment of the present invention. The integrated-inverter electric compressor 1 includes a housing 2 constituting an outer shell thereof. The housing 2 is constructed by integrally securing a motor housing 3 for accommodating an electric motor, not shown in the drawing, and a compressor housing 4 for accommodating a compressor, not shown in the drawing, by tightening bolts 5. The motor housing 3 and the compressor housing 4 are formed by aluminum die-casting.

The electric motor and the compressor, which are not shown in the drawing, accommodated in the motor housing 3 and the compressor housing 4, respectively, are linked via a motor shaft, and the compressor is driven as a result of the electric motor being rotated. A suction port 6 is provided at the rear end (on the right side of FIG. 1) of the motor housing 3, so that low-pressure refrigerant gas drawn from this suction port 6 into the motor housing 3 flows around the electric motor and goes into the compressor, where the low-pressure refrigerant gas is compressed. As a result of being compressed by the compressor, high-temperature and high-pressure refrigerant gas is discharged into the compressor housing 4 and is expelled to the outside via a discharge port 7 provided at the front end (on the left side of FIG. 1) of the compressor housing 4.

The housing 2 has three mounting legs 8A, 8B, and 8C; one leg is at a lower part of the rear end (on the right side of FIG. 1) of the motor housing 3, one leg is at a lower part of the front end (on the left side of FIG. 1) of the compressor housing 4, and one leg is at an upper part of the compressor housing 4. The integrated-inverter electric compressor 1 is secured to a vehicle via these mounting legs 8A, 8B, and 8C by affixing it with retainers, such as bolts, to a cantilever bracket fixed on a side wall, etc. of a prime mover for driving the vehicle, not shown in the drawing.

Figure 2:
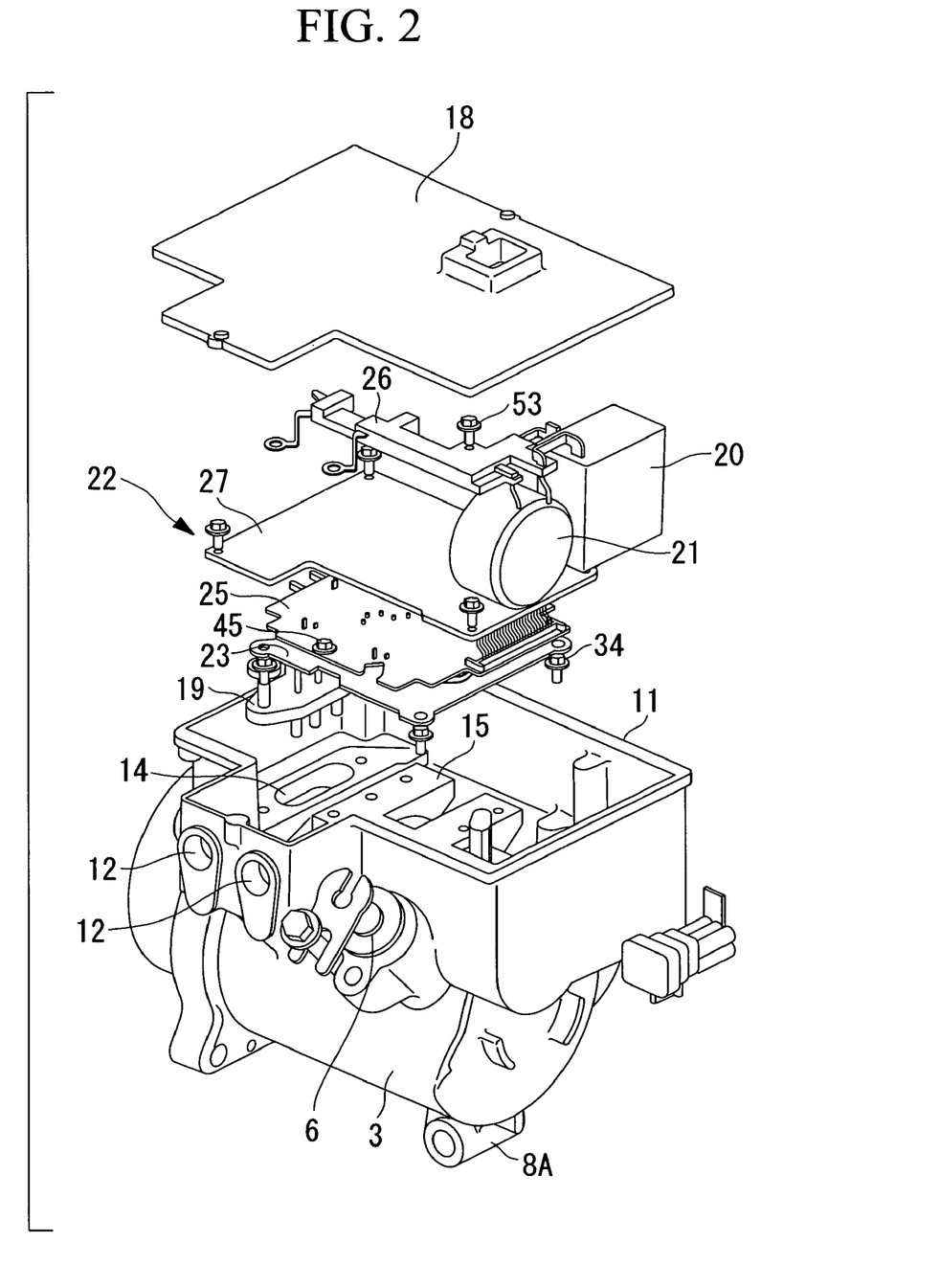
FIG. 2 is an exploded perspective view of the integrated-inverter electric compressor shown in FIG. 1, as taken from a motor housing side.
Figure 3:
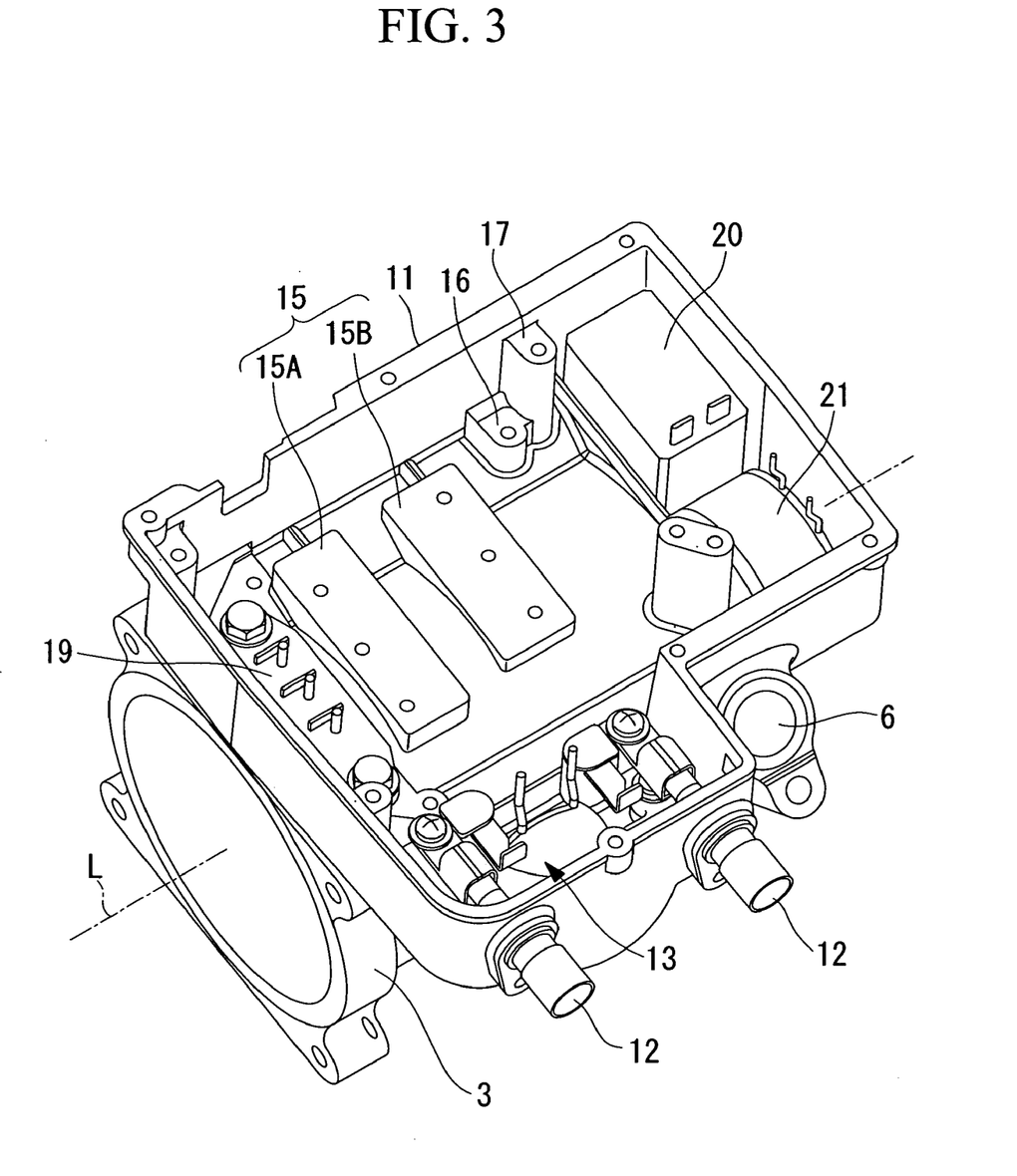
FIG. 3 is top perspective view of the motor housing of the integrated-inverter electric compressor shown in FIG. 1.

Furthermore, a box-shaped inverter container 11 is integrally formed at an upper part of the outer circumferential surface of the motor housing 3. As shown in FIGS. 2 and 3, the inverter container 11 is shaped like a box which has an open top and which is composed of surrounding walls of a certain height. Two power cable outlets 12 are provided on a side surface of the inverter container 11. A DC power P-N terminal 13 to which a power cable is connected, a motor-terminal mounting hole 14, a metal-plate heat-dissipating surface 15, metal-plate mounting bosses 16, CPU-substrate mounting bosses 17, and so forth are provided in the inverter container 11. In addition, the inverter container 11 accommodates a motor terminal 19 mounted in the motor-terminal mounting hole 14, a head capacitor 20, an inductor 21, an inverter device 22, and so forth. The top of the inverter container 11 is covered with a lid 18 that is secured with screws.

The heat-dissipating surface 15 serves to release heat generated by six power semiconductor switching devices 24, which will be described later, via the housing wall to low-temperature refrigerant gas flowing in the motor housing 3. This heat-dissipating surface 15 includes two heat-dissipating surfaces 15A and 15B: one corresponding to upper-arm switching devices 24A and the other corresponding to lower-arm switching devices 24B for the three phases (UVW) of a three-phase inverter. These two heat-dissipating surfaces 15A and 15B are finished by cutting processing. In contrast, most of the inner surface of the inverter container 11, including the part between the above-described two heat-dissipating surfaces 15A and 15B, remains as a die-casting molded surface.

Figure 5:
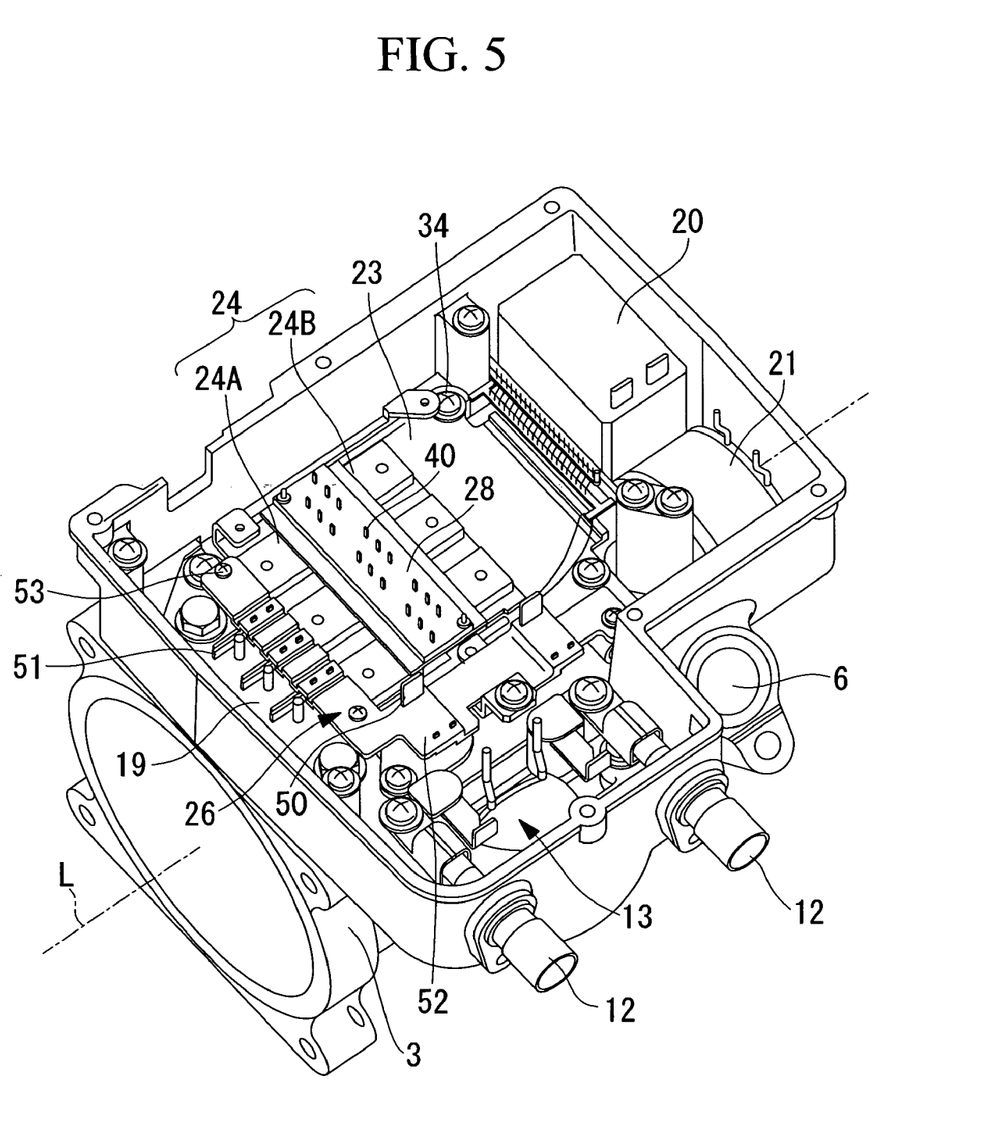
FIG. 5 is a top perspective view of the motor housing, when the inverter device of the integrated-inverter electric compressor shown in FIG. 1 is installed therein.

As shown in FIGS. 2 and 5, the inverter device 22 includes a metal plate 23 made of an aluminum alloy, functioning as a heat sink, which is fixed on the bosses 16 at four corners such that it is in contact with the heat-dissipating surface 15 of the inverter container 11; six power semiconductor switching devices (hereinafter, referred to as Insulated Gate Bipolar Transistors or "IGBTs") 24 (see FIGS. 5 and 6) constituting the upper-arm switching devices and the lower-arm switching devices for the phases of the three-phase inverter mounted on this metal plate 23; a power substrate 25 on which a power-related control circuit for operating the IGBTs 24 is mounted and which is secured to bosses on the metal plate 23; a busbar assembly 26 integrally formed by insert-molding a plurality of busbars, functioning as wiring of the inverter device 22, with resin serving as an insulator; a CPU substrate 27 on which a circuit having elements which operate at low voltage, such as a CPU, is mounted and which is secured to the bosses 17 at the four corners thereof; and a guide member 28 (see FIGS. 5 to 9) for securing the terminals of the IGBTs 24 disposed between the upper surface of the six IGBTs 24 and the power substrate 25.

Figure 4:
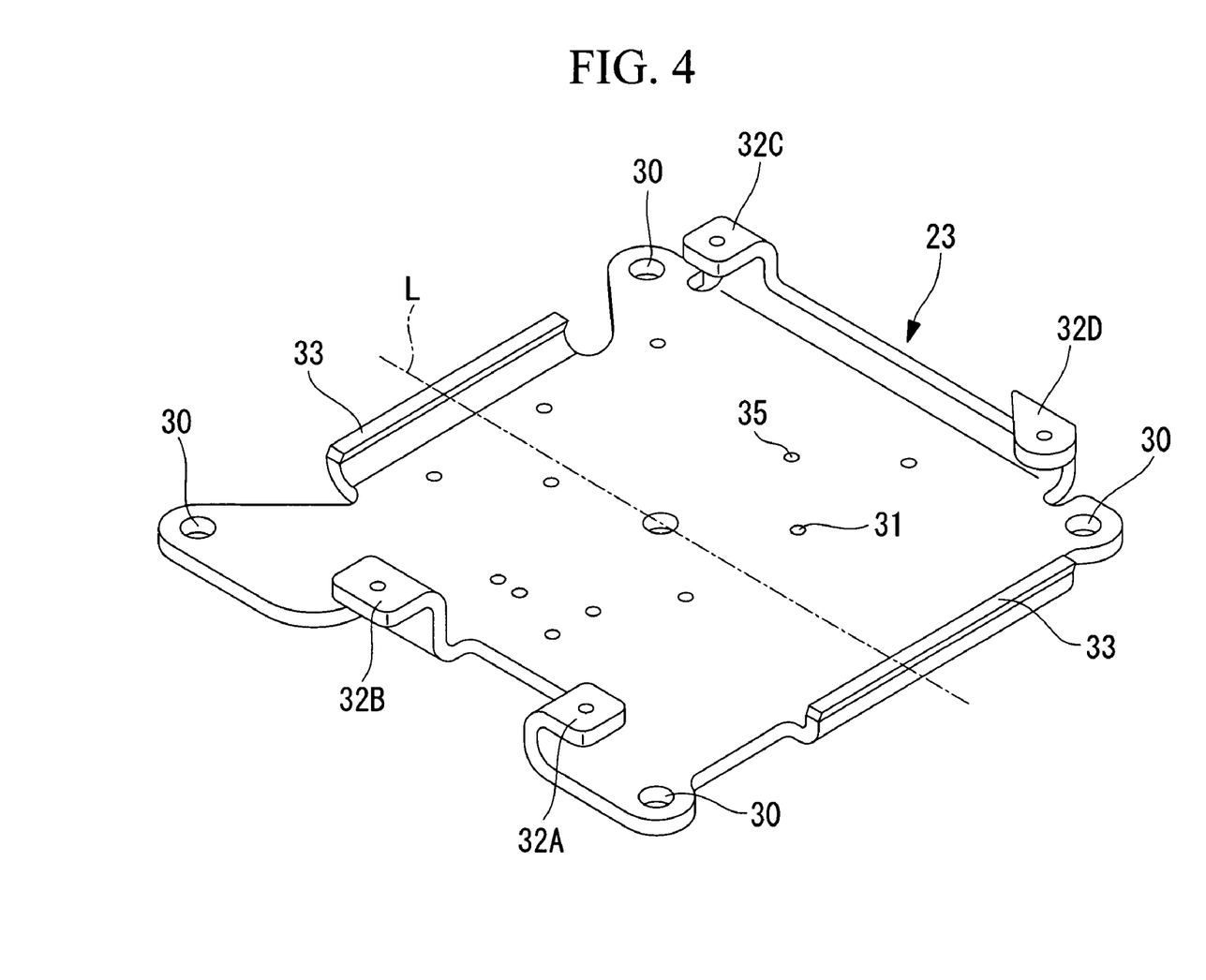
FIG. 4 is a perspective view of a metal plate constituting an inverter device of the integrated-inverter electric compressor shown in FIG. 1.

As shown in FIG. 4, the metal plate 23 made of an aluminum alloy is a rectangular pressed plate or die-cast plate which has threaded holes 30 formed at the four corners thereof for securing the metal plate 23 to the bosses 16 of the inverter container 11 with screws 34. This metal plate 23 is provided with a plurality of holes 31 for mounting the six IGBTs 24 and a plurality of bosses 32A to 32D for mounting the power substrate 25. In order to increase the stiffness of the metal plate 23 in the direction perpendicular to the motor shaft direction L, the metal plate 23 is further provided with ribs (protrusions) 33 that are formed by bending the metal plate 23 upward at both end portions thereof in the motor shaft direction L so as to extend in the width direction of the metal plate 23. In addition to the threaded holes 30 at the four corners, the metal plate 23 can also be provided with a threaded hole 30A at a substantially central location thereof.

In order to firmly secure the power substrate 25, the above-described bosses 32A to 32D for securing the power substrate 25 are formed at at least three locations (four locations in this embodiment) by bending up part of the metal plate 23. The bent section of at least one boss (32A in this example) of the bosses 32A to 32D is bent in the direction perpendicular to the motor shaft direction L, that is, in the direction parallel to the ribs (protrusions) 33. The ribs (protrusions) 33 need not be formed by bending both end portions of the metal plate 23. Instead, a plurality of (at least two) ribs (protrusions) 33 may be provided, spaced at predetermined intervals, in parallel at a substantially central position of the plate.

Figure 7:
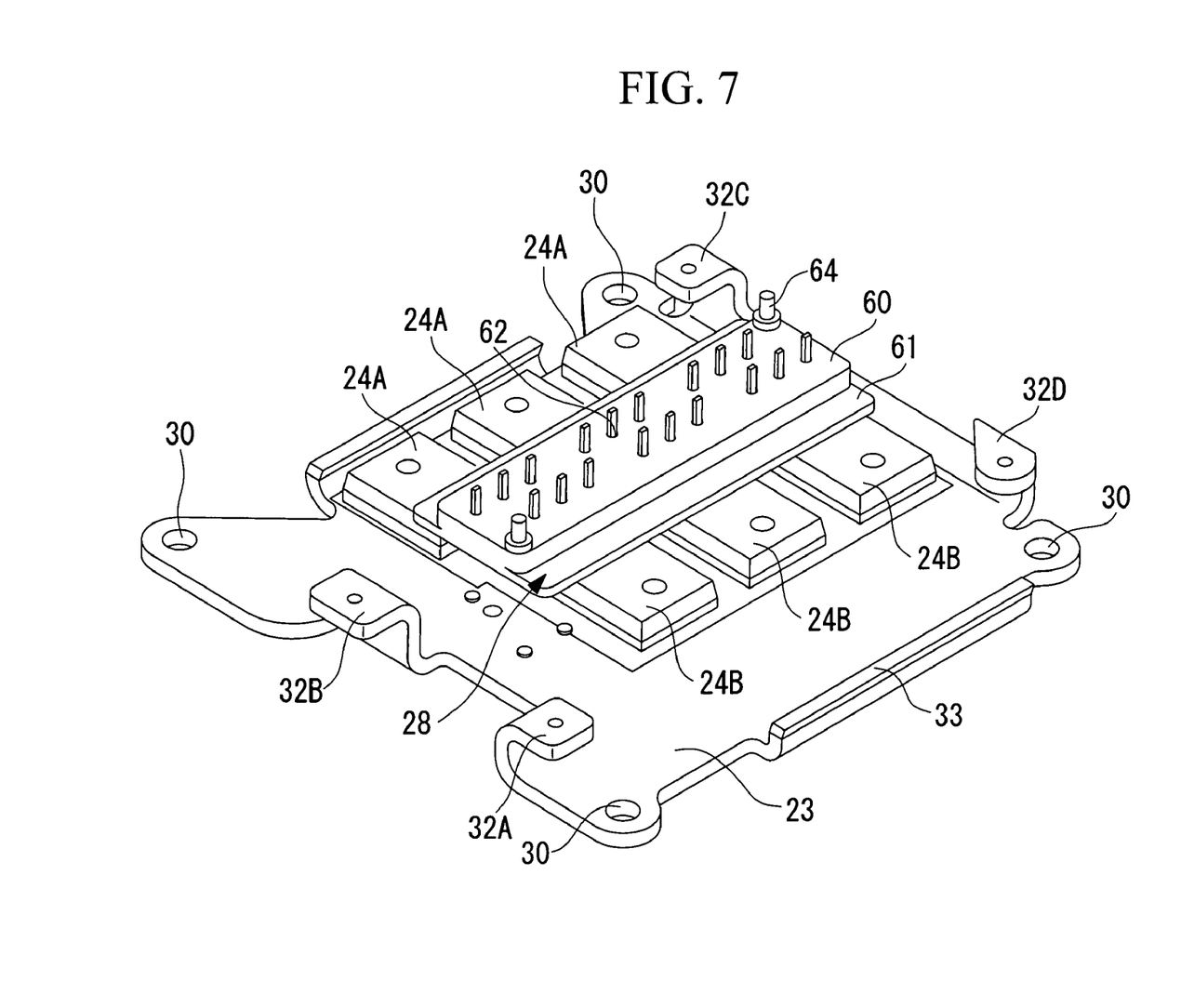
FIG. 7 is a perspective view in which an IGBT and a guide member are mounted on the metal plate constituting the inverter device of the integrated-inverter electric compressor shown in FIG. 1.

As shown in FIGS. 5 and 7, each of the six IGBTs 24 is formed in a box-shape by resin molding and has a total of three terminals 40 arranged in a straight line, that is, two main electrode terminals and one control electrode terminal, which extend outwards from one side surface of the IGBTs 24, and which are bent upwardly in an L shape. These six IGBTs 24 include three IGBTs 24A corresponding to the upper-arm three phases (UVW) and three IGBTs 24B corresponding to the lower-arm three phases (UVW). The three IGBTs 24A and the three IGBTs 24B are arranged side by side, in two groups of three each, in the direction perpendicular to the motor shaft direction L and are arranged in two rows in the motor shaft direction L in such a manner that the corresponding terminals 40 arranged in a straight line face each other. The IGBTs 24 are then secured by screws or the like on the metal plate 23, with an insulating sheet (not shown) disposed therebetween, at positions corresponding to the heat-dissipating surfaces 15A and 15B.

Figure 6:
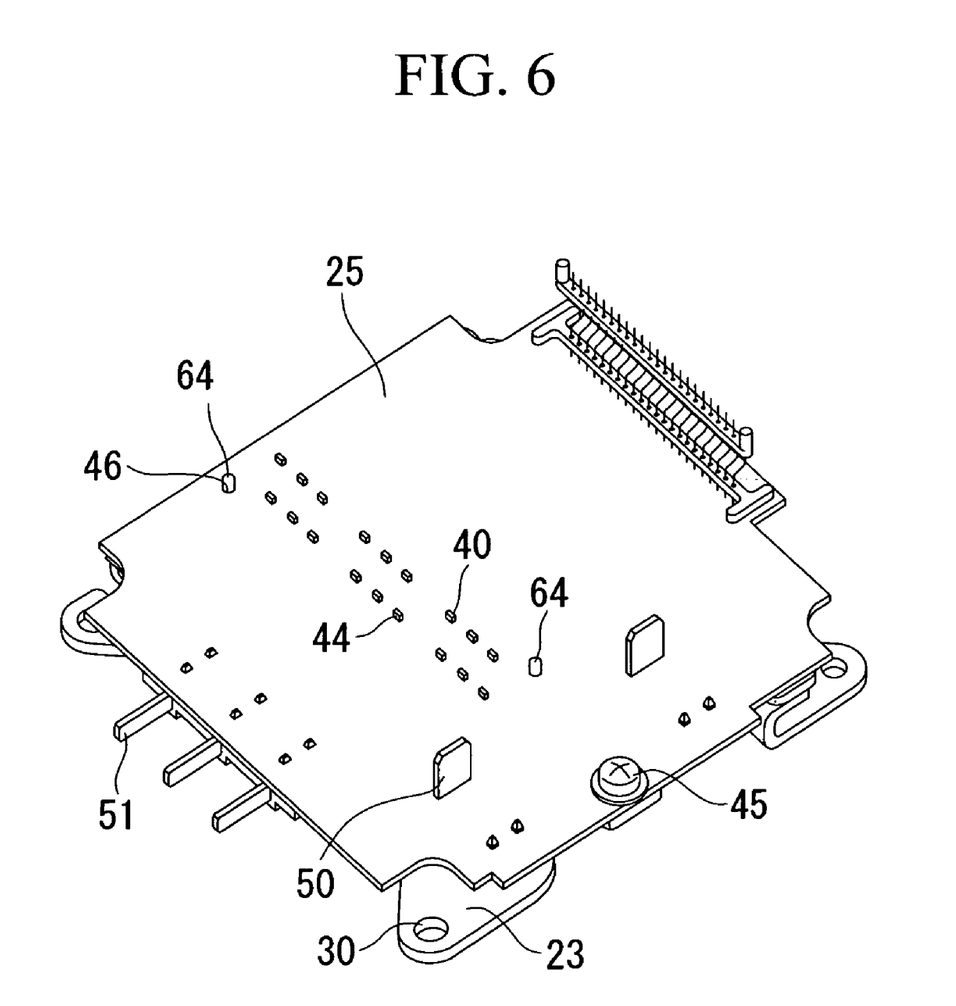
FIG. 6 is an overall perspective view of a power substrate constituting the inverter device of the integrated-inverter electric compressor shown in FIG. 1.

As shown in FIGS. 2 and 6, the power substrate 25 having the power-related control circuit includes eighteen connecting holes 44 (see FIG. 9) to be engaged with the eighteen terminals 40 of the six IGBTs 24. The terminals 40 are fitted in these connecting holes 44 and are soldered to a surrounding conductive pattern. The circuit on the power substrate 25 has a function for intermittently controlling the IGBTs 24 based on an external command to supply power to the electric motor, a function for externally transmitting a driving state of the electric motor, and other functions. This power substrate 25 is secured via screws 45 to the four bosses 32A to 32D on the metal plate 23 so as to be integrated with the metal plate 23.

As shown in FIG. 5, the busbar assembly 26 is formed as a single component by integrating, with an insert-molding resin 52, a plurality of busbars, such as P-N busbars 50 connecting the IGBTs 24 to the DC power P-N terminal 13 and U-V-W busbars 51 connecting the IGBTs 24 to the motor terminal 19. This busbar assembly 26 is formed in an L shape so as to face the DC power P-N terminal 13 and the motor terminal 19 and is integrally secured on the power substrate 25 with screws 53 along two adjacent sides of the power substrate 25. In addition, the busbar assembly 26 is so designed that when the power substrate 25 is secured with screws on the metal plate 23, the busbar assembly 26 is positioned between those screws.

Figure 8:
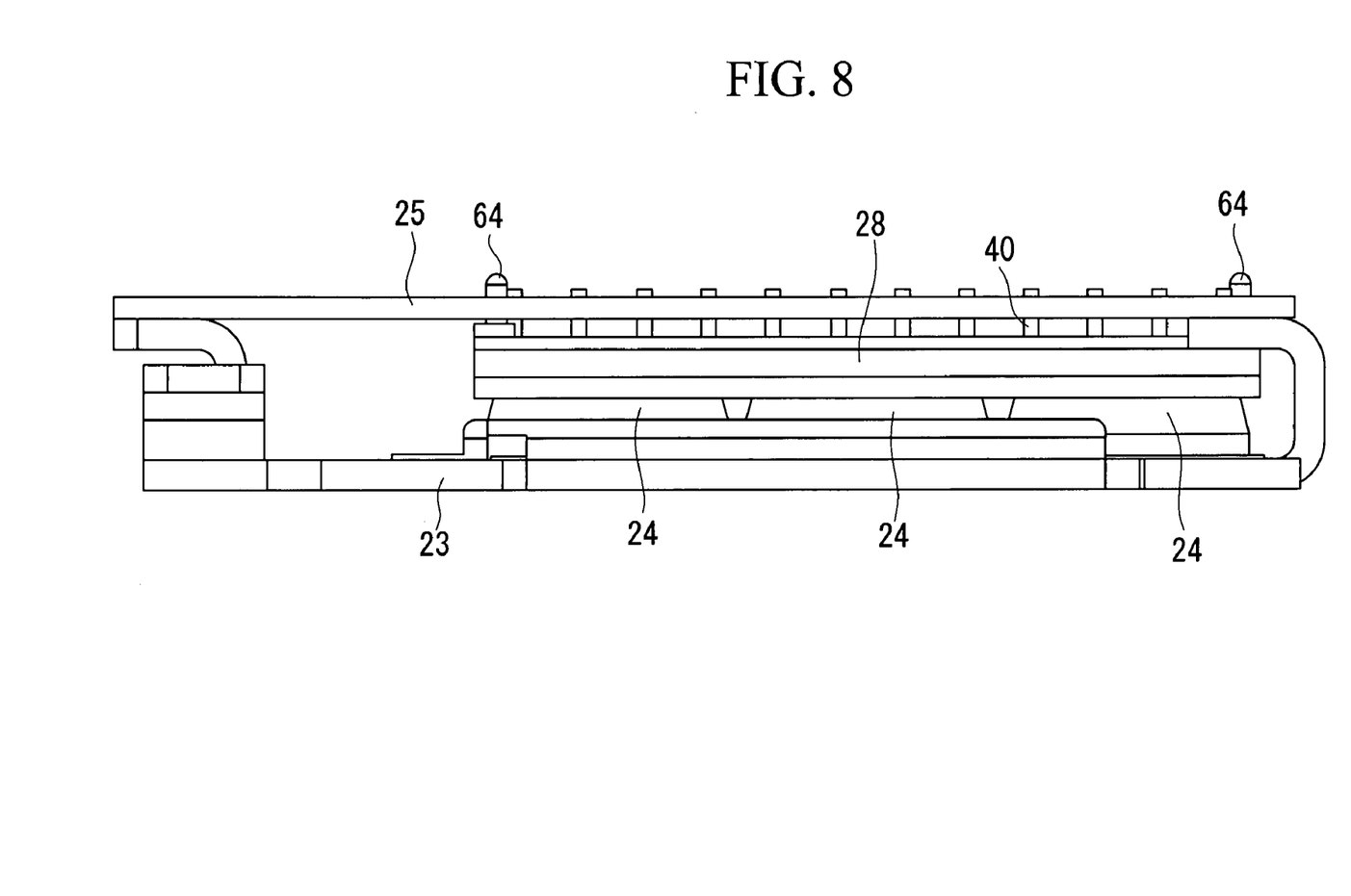
FIG. 8 is a sectional view in which an IGBT and a guide member are mounted on a metal plate constituting the inverter device of the integrated-inverter electric compressor shown in FIG. 1.
Figure 9:
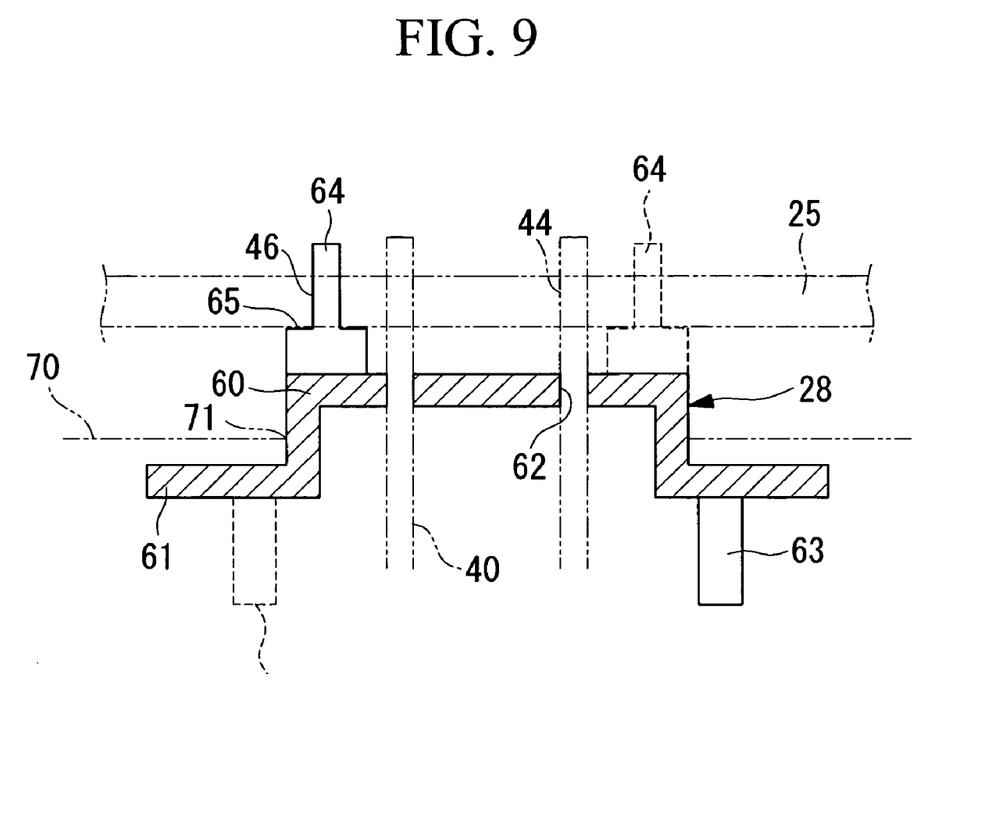
FIG. 9 is a sectional view of a guide member constituting the inverter-device of the integrated-inverter electric compressor shown in FIG. 1.

As shown in FIGS. 7 to 9, the guide member 28 for securing the terminals of the IGBTs 24 has a rectangular guide body 60 whose cross section is an angular-U-shape and which has flanges 61 perpendicularly protruding from both edges thereof; through-holes 62 for passing the terminals 40 of the IGBTs 24 arranged in two straight lines of nine through-holes 62 each on a flat surface of the guide body 60; a pair of first positioning pins 63 mounted on the bottom surfaces of the flanges 61 of the guide body 60 and downwardly protruding from diagonally opposite corners; and a pair of second positioning pins 64 mounted on the upper surface of the guide body 60 and upwardly protruding from the diagonally opposite corners in an orientation crossing the first positioning pins 63. This guide member 28 has a length in the vertical direction (thickness) corresponding to the space between the IGBTs 24 and the power substrate 25 and can be integrated with the first positioning pins 63 and the second positioning pins 64 to form a thin resin molded object.

The first positioning pins 63 are fitted in the positioning holes 35 (see FIG. 4) provided in the metal plate 23 to position and secure the guide member 28 relative to the metal plate 23. The second positioning pins 64 are fitted in the positioning holes 46 (see FIG. 9) provided in the power substrate 25 to position and secure the guide member 28 relative to the power substrate 25. Stepped portions 65 having a predetermined height are provided at the base portions of the second positioning pins 64, and the step surfaces thereof are disposed in contact with the lower surface of the power substrate 25. By fitting the first positioning pins 63 and the second positioning pins 64 in the positioning holes 35 and 46 in the metal plate 23 and the power substrate 25, the guide member 28 can be positioned and secured between the upper surface of the IGBTs 24 and the power substrate 25, with the terminals 40 of the IGBTs 24 passing through the through-holes 62.

An electrical insulating film 70 (see FIG. 9) is disposed between the IGBTs 24 and the power substrate 25 to ensure an insulating distance therebetween. An opening 71 in which the guide body 60 of the guide member 28 is fitted is provided in this electrical insulating film 70. When the electrical insulating film 70 is interposed between the IGBTs 24 and the power substrate 25, the electrical insulating film 70 can be installed without shifting in position by fitting the guide body 60, serving as a positioning guide, with the opening 71.

As described above, the inverter device 22 is so configured that the six IGBTs 24, the power substrate 25, and the busbar assembly 26 are disposed on the metal plate 23, with the terminal-securing guide member 28 of the IGBTs 24 disposed therebetween, and is accommodated in the inverter container 11 of the motor housing 3 such that the bottom surface of the metal plate 23 is in contact with the heat-dissipating surfaces 15A and 15B. Furthermore, the CPU-substrate 27 constituting the inverter device 22 is configured so as to be secured with screws to mounting bosses 17, and the lid 18 is placed on the top of the inverter device 22.

According to the above-described embodiment, the following advantages are provided.

The three-phase inverter device 22 is formed of a total six IGBTs 24, i.e., the three upper-arm IGBTs 24A and the three lower-arm IGBTs 24B, which are mounted on the metal plate 23. The three terminals 40 upwardly extend from each of these IGBTs 24, are fitted in the connecting holes 44 of the power substrate 25 disposed on the metal plate 23 and are soldered. At this time, by disposing the guide member 28, having the guide holes 62, between the IGBTs 24 and the power substrate 25, and by passing the eighteen terminals 40 extending from the IGBTs 24 through the guide holes 62, it is possible to align each of the terminals 40, which are easily shifted in the extending direction by an external force when being mounted, in a straight line. Accordingly, the eighteen terminals 40 can be easily fitted in the connecting holes 44 of the power substrate 25, which makes it easy to assemble the IGBTs 24 and the power substrate 25, and eventually the inverter device 22.

In particular, because the terminals 40 extending from each of the IGBTs 24 are arranged in two straight lines, and the guide holes 62 of the guide member 28 are arranged in two straight lines so as to correspond to these terminals 40, the terminals 40 can be arranged in two straight lines by passing through the guide holes 62 of the guide member 28, thus allowing the aligned terminals 40 to be fitted in the connecting holes 44 of the power substrate 25. Accordingly, the fitting operation of the guide member 28 and the power substrate 25 relative to each terminal 40 can be carried out more easily, thus allowing ease of assembly of the guide member 28 and the power substrate 25 to be improved.

Vibrations in the vehicle are directly transmitted to the electric compressor 1 and the inverter device accommodated therein. With these vibrations, the IGBTs 24, the terminals 40, the power substrate 25, and so forth also vibrate accordingly. Because the guide member 28 is positioned and secured between the IGBTs 24 and the power substrate 25 by the first positioning pins 63 and the second positioning pins 64 fitted in the positioning holes 35 and 46 of the metal plate 23 and the power substrate 25, it is possible to secure each of the terminals 40 of the IGBTs 24 with the guide member 28. Accordingly, the terminals 40 can be protected from external forces caused by the vibrations or the like applied to the terminals 40; therefore, the vibration resistance of the inverter device 22 can be enhanced.

The stepped portions 65 having a predetermined height are disposed at the base portions of the second positioning pins 64 provided on the guide member 28. The vertical position of the power substrate 25 is determined by the step surfaces thereof, and a space corresponding to the height of the stepped portions 65 is formed between the guide member 28 and the power substrate 25. Accordingly, when the terminals 40 of the IGBTs 24 are soldered to the power substrate 25, even if the solder flows between the guide member 28 and the power substrate 25, it is possible to prevent an adverse affect on the power substrate 25, for example, deformation of the power substrate 25 caused by contact with the solder and so on. The assembling quality and the reliability of the inverter device 22 can thus be enhanced.

The first positioning pins 63 and the second positioning pins 64 for securing the guide member 28 between the IGBTs 24 and the power substrate 25 are provided in pairs at corners of the guide member 28 on diagonal lines that cross each other. Because the first positioning pins 63 and the second positioning pins 64 are fitted in the positioning holes 35 and 46, the guide member 28 can be accurately positioned and secured without spaces between it and the positioning holes 35 and 46 of the metal plate 23 and the power substrate 25. Accordingly, the assembly accuracy of the inverter device 22 formed of the metal plate 23, the IGBTs 24, the power substrate 25, and so forth can be enhanced, and the quality and reliability thereof can thus be improved.

The guide member 28 includes the flanges 61 perpendicularly protruding from both edges of the guide body 60, whose cross section is an angular-U-shape, and a rectangular resin molded object in which the first positioning pins 63 and the second positioning pins 64 are integrally formed. Although this guide member 28 needs to have a thickness corresponding to the space between the IGBTs 24 and the power substrate 25, with the above-described configuration, it can be integrally formed as a thin resin molded object. Therefore, it is possible to minimize the weight and cost of the guide member 28.

Furthermore, by using the guide body 60 of the guide member 28 as a positioning guide, it is possible to install the electrical insulating film 70 between the IGBTs 24 and the power substrate 25 without any positional shifting by fitting the guide body 60 with the opening 71. Ease of assembly of the electrical insulating film 70 can thus be improved.

In addition, although the IGBTs (power semiconductor switching devices) 24 of the inverter device 22 are secured on the metal plate 23 made of an aluminum alloy in the above-described embodiment, the present invention is not limited to the structure employed in this embodiment. The IGBTs 24 may be directly secured on the heat-dissipating surface 15 of the motor housing 3. In such a case, the positioning holes 35 are also provided at the heat-dissipating surface 15.

In addition, although the IGBTs (power semiconductor switching devices) 24 are formed as discrete components, by resin molding, in the above-described embodiment. Instead, the IGBTs (power semiconductor switching devices) 24 may be fabricated as bare chips.

In addition, although the suction port 6 is mounted on the side surface at the rear end of the motor housing 3 in this embodiment, the suction port 6 may be provided on the rear end surface of the motor housing 3.

Furthermore, the compressor, which has not been described in detail, may be any type of compressor.

What is claimed is:

1. An integrated-inverter electric compressor wherein an inverter container is provided on an outer circumference of a housing accommodating an electric compressor, and an inverter device for converting DC power to three-phase AC power and supplying the converted power to an electric motor is installed in the inverter container, wherein the inverter device comprises a plurality of power semiconductor switching devices from which respective pluralities of terminals extend; and a control substrate which has a plurality of connecting holes for fitting the terminals and on which a circuit for operating the power semiconductor switching devices is mounted;

a guide member having a plurality of guide holes for passing the terminals is provided between the power semiconductor switching devices and the control substrate; and the guide member is provided with at least one first positioning pin, fitted in positioning holes provided in mounting surface of the power semiconductor switching devices, in one side surface facing the power semiconductor switching devices, and at least one second positioning pin, fitted in positioning holes provided in the control substrate, in another side surface facing the control substrate.

2. An integrated-inverter electric compressor according to claim 1, wherein the second positioning pin is provided with a stepped portion having a predetermined height at a base portion thereof, and a step surface thereof is positioned in contact with the control substrate.

3. An integrated-inverter electric compressor according to claim 1, wherein the guide member is integrally formed of a rectangular resin molded object whose cross section is an angular-U-shape and which has flanges perpendicularly protruding from both edges of a guide body, and the flanges are positioned in contact with an upper surface of the power semiconductor switching devices or the mounting surface thereof.

4. An integrated-inverter electric compressor according to claim 3, wherein the first positioning pins and the second positioning pins are provided in pairs at corners of the guide member on diagonal lines that cross each other.

5. An integrated-inverter electric compressor according to claim 3, wherein an electrical insulating film is disposed between the power semiconductor switching devices and the control substrate and is provided with an opening in which the angular-U-shaped cross section of the guide body is fitted.

6. An integrated-inverter electric compressor according to claim 1, wherein the terminals extending from upper-arm switching devices and lower-arm switching devices of the power semiconductor switching devices are arranged in a straight line; and the guide holes provided in the guide member in correspondence with the terminals are arranged in two straight lines.

7. A method for producing an integrated-inverter electric compressor wherein an inverter container is provided on an outer circumference of a housing accommodating an electric compressor, and an inverter device for converting DC power to three-phase AC power and supplying the converted power to an electric motor is installed in the inverter container, the inverter device having: a plurality of power semiconductor switching devices from which respective pluralities of terminals extend; a control substrate which has a plurality of connecting holes for fitting the terminals and on which a circuit for operating the power semiconductor switching devices is mounted; a guide member whose cross section is an angular-U-shape and which has flanges perpendicularly protruding from both edges of the guide member, having a plurality of guide holes for passing the terminals; an electrical insulating film having openings in which the guide member is fitted; and a metal plate functioning as a heat sink;

the method comprising:

disposing the power semiconductor switching devices in predetermined arrangement on the metal plate;

mounting the guide member at an upper part of a plurality of power semiconductor switching devices;

fitting the openings in the electrical insulating film with the guide member;

fitting the terminals of the power semiconductor switching devices with the connecting holes of the control substrate via the guide member and the electrical insulating film.

8. A guide member for an integrated-inverter electric compressor wherein an inverter container is provided on an outer circumference of a housing accommodating an electric compressor, and an inverter device for converting DC power to three-phase AC power and supplying the converted power to an electric motor is installed in the inverter container, the inverter device having: a plurality of power semiconductor switching devices from which respective pluralities of terminals extend; and a control substrate on which a circuit for operating the power semiconductor switching devices is mounted;

the guide member being configured to be disposed between the power semiconductor switching devices and the control substrate; and the guide member comprising:

an integrally-formed rectangular resin-molded object whose cross section is an angular-U-shape and which has flanges perpendicularly protruding from both edges of the guide member;

at least one first positioning pin, configured to be fitted in positioning holes provided in mounting surface of the power semiconductor switching devices, the first positioning pin being provided in one side surface of the flanges facing the power semiconductor switching devices, and at least one second positioning pin, configured to be fitted in positioning holes provided in the control substrate, the second positioning pin being provided in another side surface of the flanges facing the control substrate.

* * * * *